United States Patent
Coronel et al.

[11] Patent Number: 5,930,585
[45] Date of Patent: Jul. 27, 1999

[54] COLLAR ETCH METHOD TO IMPROVE POLYSILICON STRAP INTEGRITY IN DRAM CHIPS

[75] Inventors: Phillipe Coronel, Massy; Renzo Maccagnan, Villabe, both of France

[73] Assignee: International Business Machines Corporation, Armonk, N.Y.

[21] Appl. No.: 08/771,599

[22] Filed: Dec. 20, 1996

[30] Foreign Application Priority Data

Jul. 23, 1996 [EP] European Pat. Off. ............. 96480092

[51] Int. Cl.⁶ .................................................. H01L 21/00
[52] U.S. Cl. ........................... 438/5; 438/9; 438/714; 438/723; 438/733; 438/738; 438/740; 438/743
[58] Field of Search ................................ 438/9, 714, 723, 438/733, 738, 740, 743, 5

[56] References Cited

U.S. PATENT DOCUMENTS

| | | | |
|---|---|---|---|
| 4,668,338 | 5/1987 | Maydan et al. | 437/714 |
| 4,966,870 | 10/1990 | Barber et al. | 437/228 |
| 5,286,344 | 2/1994 | Blalock et al. | 438/723 |
| 5,312,518 | 5/1994 | Kadomura | 438/723 |
| 5,356,515 | 10/1994 | Tahara et al. | 156/643.1 |
| 5,366,590 | 11/1994 | Kadomura | 438/723 |
| 5,423,945 | 6/1995 | Marks et al. | 156/662.1 |
| 5,433,823 | 7/1995 | Cain | 438/723 |
| 5,445,712 | 8/1995 | Yanagida | 216/67 |
| 5,503,901 | 4/1996 | Sakai et al. | 438/723 |
| 5,505,816 | 4/1996 | Barnes et al. | 438/738 |
| 5,549,784 | 8/1996 | Carmody et al. | 438/733 |
| 5,562,801 | 10/1996 | Nulty | 216/67 |
| 5,595,627 | 1/1997 | Inazawa et al. | 156/643.1 |
| 5,626,716 | 5/1997 | Bosch et al. | 438/723 |
| 5,631,179 | 5/1997 | Sung et al. | 438/264 |
| 5,650,339 | 7/1997 | Saito et al. | 437/21 |
| 5,702,981 | 12/1997 | Maniar et al. | 437/192 |
| 5,739,573 | 4/1998 | Kawaguchi | 257/384 |
| 5,770,098 | 6/1998 | Araki et al. | 216/67 |

OTHER PUBLICATIONS

Lee, H.-J., et al "Selective SiO2/Si3N4 etching in magnetized inductively coupled C4F8 plasma" J. Vac. Sci. Technol. B 16(2) pp. 500–506, Mar. 1998.

*Primary Examiner*—Richard Bueker
*Attorney, Agent, or Firm*—Robert A. Walsh

[57] ABSTRACT

In the manufacture of 16 Mbits DRAM chips, a polysilicon strap is used to provide an electrical contact between the drain region of the active NFET device and one electrode of the storage capacitor for each memory cell. The storage capacitor is formed in a trench etch in a silicon substrate which is partially filled with polysilicon. The substrate is conformally coated by a TEOS $SiO_2$ collar layer having a non-uniform thickness. A chemistry having a high TEOS $SiO_2/Si_3N_4$ and polysilicon selectively (i.e. which etches TEOS $SiO_2$ faster than $Si_3N_4$ and polysilicon by a factor of at least 6) is used to anisotropically etch the collar layer. $C_4F_8/Ar/C$) mixtures which have selectivities of 9:1 and 15:1 are adequate. When the surface of the $Si_3N_4$ pad layer is reached (this can be accurately detected), the etch is continued a short period of time to ensure the complete removal of the horizontal portions of the collar layer, including at the trench bottom, but not the vertical portions in the trench sidewalls.

7 Claims, 10 Drawing Sheets

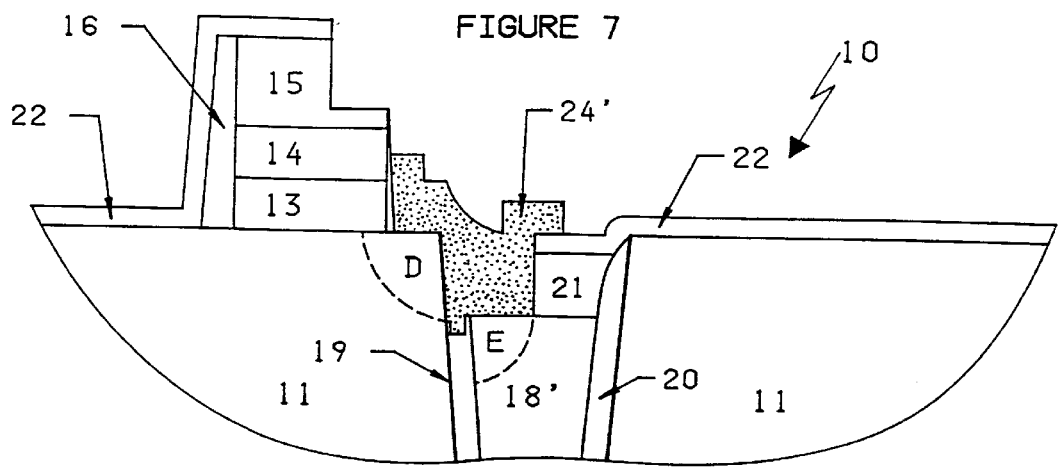
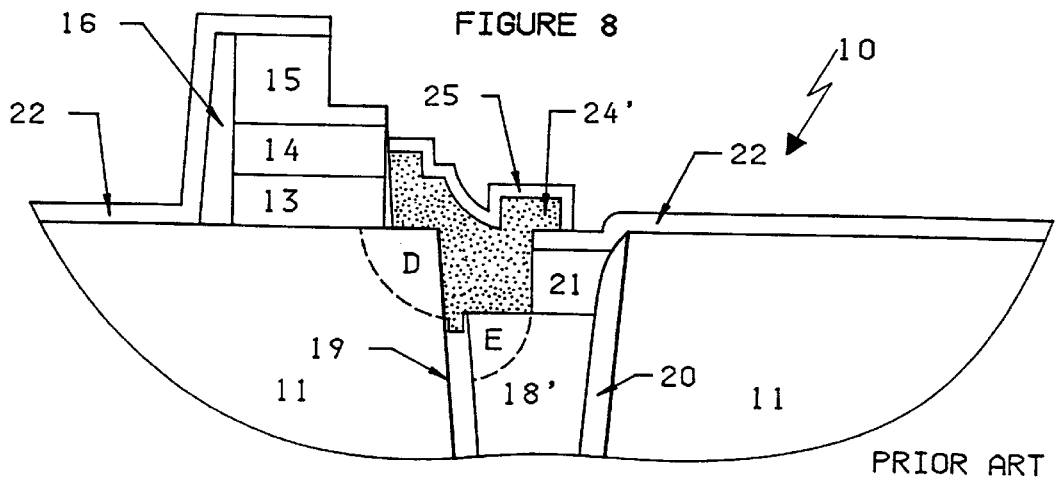
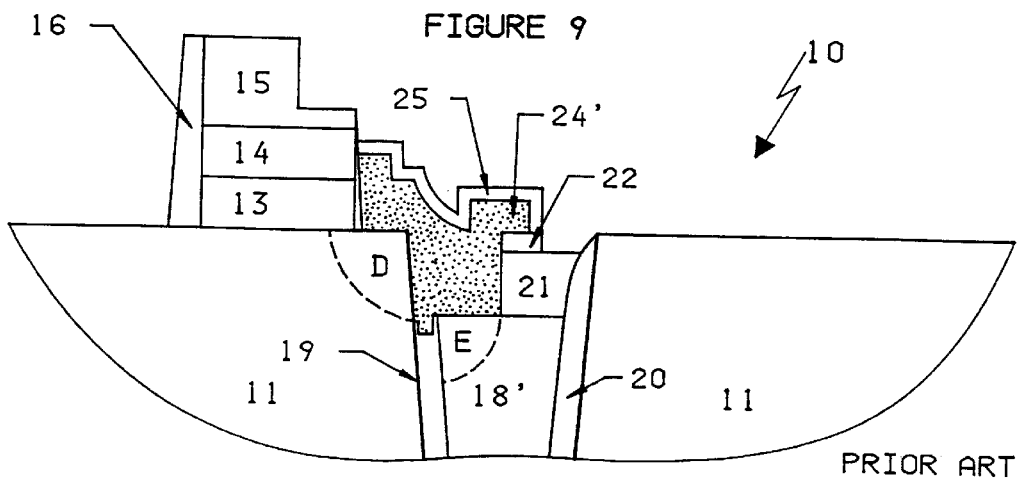

FIGURE 10
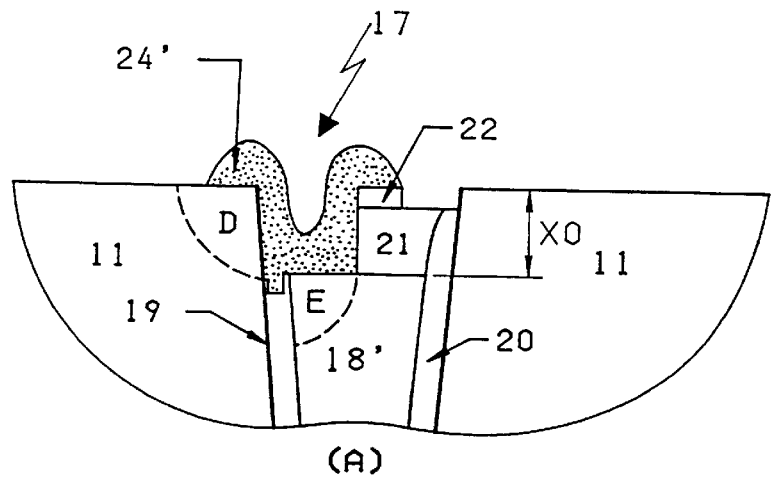
(A)
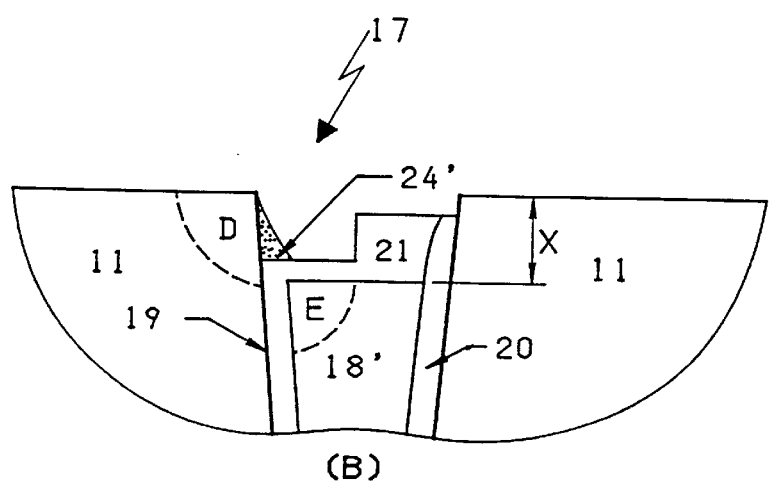
(B)
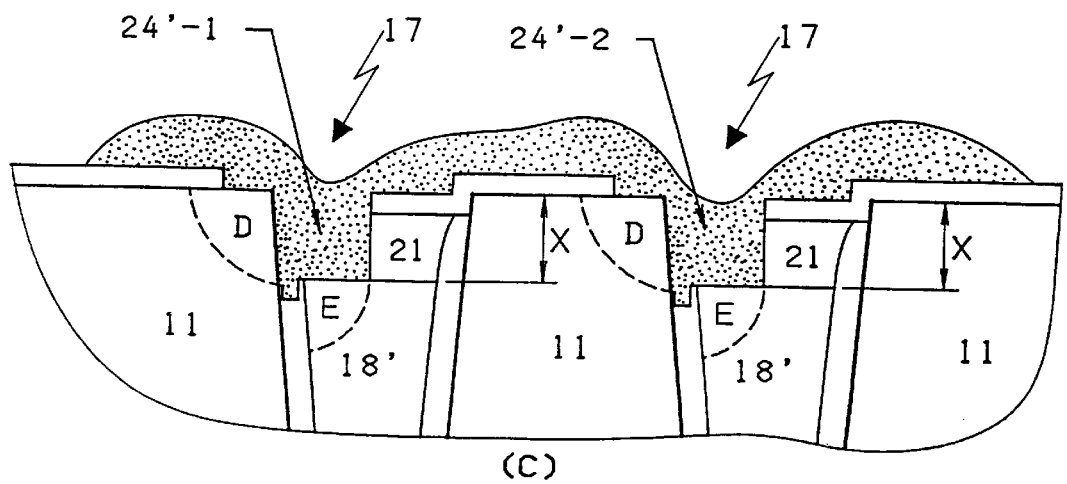
(C)

FIGURE 11
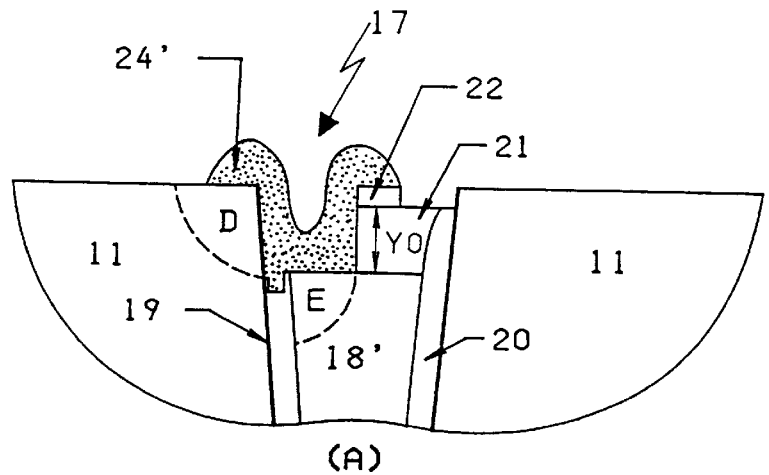
(A)
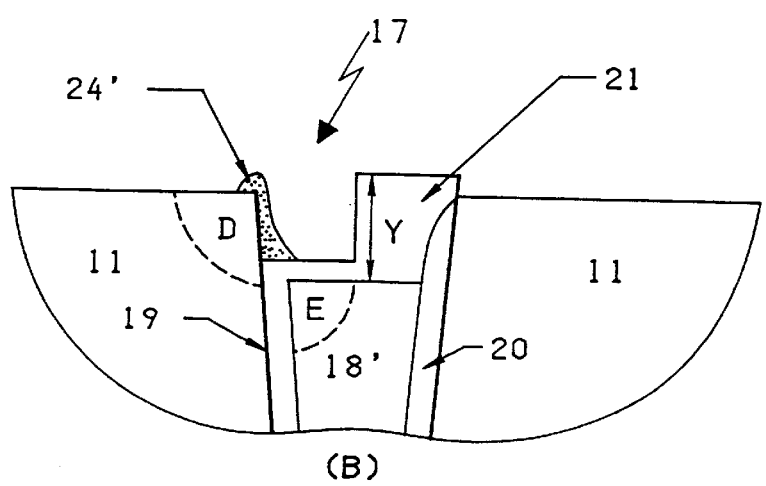
(B)
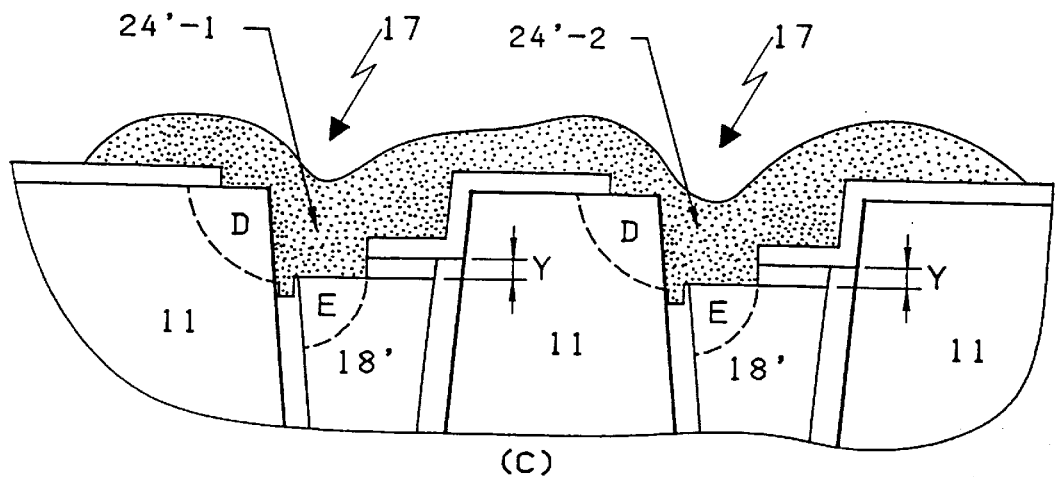
(C)

COLLAR ETCH METHOD TO IMPROVE POLYSILICON STRAP INTEGRITY IN DRAM CHIPS

FIELD OF INVENTION

The present invention relates to the manufacture of semiconductor integrated circuits and more particularly to a new collar dry etch method for improving the integrity of polysilicon straps that are extensively used in deep trench capacitor DRAM chips.

BACKGROUND OF THE INVENTION

In the manufacture of semiconductor integrated circuits, (IC's), in particular of 16 Mb DRAM chips, polysilicon straps are extensively used. In each elementary memory cell, a polysilicon strap allows an electrical contact between the drain region of the active NFET device and one electrode of the storage capacitor. As far as the specific steps of the polysilicon strap fabrication are concerned, a conventional fabrication process basically includes nine basic steps after the gate conductor (GC) stack/TEOS $SiO_2$ spacer formation has been completed in the GC module.

These nine steps consist of: (1) depositing a blanket layer of silicon nitride onto the structure that will be subsequently used as a hard mask for the boron ion implantation and out diffusion steps, (2) delineating a photomask (PS mask) over said silicon nitride layer according to the desired pattern, (3) etching exposed portions of the silicon nitride layer and the TEOS $SiO_2$ plug also referred to as the TTO (Top Trench Oxide) plug in order to expose the silicon substrate at the NFET device drain location and the portion of the doped polysilicon fill to be used as the capacitor contact electrode and then stripping the photo mask, (4) implanting boron dopants into the silicon substrate and doped polysilicon fill exposed areas, (5) conformally depositing a layer of undoped polysilicon material onto the wafer, (6) out diffusing boron dopants from implanted polysilicon and silicon into said undoped polysilicon layer to produce a doped portion to be subsequently used as the polysilicon strap, (7) removing the portions of the polysilicon layer that remain undoped with a selective KOH wet process, (8) oxidizing the said doped polysilicon strap portion, and (9) finally removing the silicon nitride hard mask. All these processing steps are conducted in the polysilicon strap (PS) module. After these nine steps have been completed, each storage capacitor is connected to the drain of its corresponding NFET device to provide the desired elementary memory cell.

FIG. 1 schematically illustrates a structure which is a part of a wafer once the gate conductor stack/TEOS $SiO_2$ spacer has been completed in the GC module. Structure 10 basically consists of a silicon substrate 11 with a gate conductor stack 12 formed thereon. The stack is comprised of a bottom 125 nm thermal $SiO_2$ layer (not shown), a 200 nm thick gate polysilicon layer 13, a 170 nm thick tungsten silicide ($WSi_2$) layer 14 and a 400 nm thick TEOS $SiO_2$ cap 15. A 120 nm thick TEOS $SiO_2$ spacer 16 coats the sides of the stack. The storage capacitor is formed in a "deep trench" referenced 17 which is filled with polysilicon material. The lower portion is filled with undoped polysilicon 18 and the upper portion is filled with doped polysilicon 18'. The undoped polysilicon fill referenced 18 is only isolated from silicon substrate 11 by a classic ONO (Oxide/Nitride/Oxide) layer 19 while the doped polysilicon fill 18' is isolated therefrom by said ONO layer 19 and a TEOS $SiO_2$ collar 20. A TEOS $SiO_2$ plug 21 is formed atop the doped polysilicon fill 18'. The structure of FIG. 1 results of a number of processing steps to which the bare silicon wafer has been submitted to and which are briefly summarized hereunder.

First of all, a $Si_3N_4$ layer (referred to as the $Si_3N_4$ pad layer no longer visible in FIG. 1) is deposited onto the bare silicon substrate 11 then patterned to delineate the areas to be etched. Next, deep trenches 17 are formed in the substrate by dry etching. The ONO layer 19 is formed on the trench sidewalls and bottom. The ONO coated trenches are filled with undoped polysilicon. During a step referred to as the "recess 1" etch step, about 2.5 $\mu$m of undoped polysilicon are removed from the trench in a plasma etcher. The TEOS $SiO_2$ collar layer 20 is conformally deposited onto the structure 10 and is an isotropically etched to leave only the portion on the sides of the trench which is referred to as the collar 20. Next, a step of blanket depositing a layer of doped polysilicon is performed and the structure is planarized to leave the doped polysilicon fill 18'. Finally, a determined amount of the doped polysilicon fill 18' is removed to form a recess. The height difference between the silicon substrate 11 surface and the top of the remaining doped polysilicon fill 18' is referred to herein below as the "recess 2" depth X. The target is to have a value of X as close as possible of a nominal value X0=160 nm. This step of forming the "recess 2" terminates the operations conducted in the so-called deep trench (DT) module. Now, shallow isolation trenches are formed in the so-called shallow trench isolation (STI) module which includes a chem-mech polishing step. The TEOS $SiO_2$ plug 21 is formed at this stage of the process. It is highly desired to have the thickness Y of said TEOS $SiO_2$ plug 21 close to a theoretical nominal value given by Y0=X0=160 nm, to exactly fill the "recess 2" produced in the DT module. The fabrication continues in the gate conductor (GC) module to achieve said gate conductor stack/ TEOS $SiO_2$ spacer formation. The specific processing steps that are now required to build the polysilicon strap between the NFET device drain and the doped polysilicon fill 18' forming one electrode of the storage capacitor at the PS module level will be now described by reference to FIGS. 2 to 9.

First, the structure 10 of FIG. 1 is coated with a 26.5 nm conformal layer 22 of silicon nitride as shown in FIG. 2 to form a hard mask for subsequent boron ion implantation and out diffusion steps. Now turning to FIG. 3, a layer 23 of a photosensitive material is deposited onto the structure 10. An adequate material is the photoresist labelled IP3250 commercially sold by TOKYO-OHKA, Tokyo, Japan which is deposited with a thickness of about 1.1 $\mu$m. After deposition, the photoresist layer 23 is exposed, then baked and developed as standard to leave a patterned layer forming photo mask 23 also referred to as the PS mask. Its role is to define the strap position at the surface of the silicon substrate 11, but as apparent from FIG. 3, a portion of the layer 22 situated above the gate stack and a spacer 16 is also exposed. This is required to overcome overlay problems due to the lithographic equipment.

The process continues with the BOSS/MTTO (Boron Out diffused Silicon Strap/Masked Top Trench Oxide) etching step. To that end, the wafer is placed in a plasma reactor such as an AME 5000, a MERIE plasma etcher manufactured by Applied Materials Inc, Santa Clara, Calif., USA, and etched with an appropriate $CHF_3/CF_4/Ar$ chemistry to expose the doped polysilicon fill 18'. The etching mixture attacks the exposed portions of the silicon nitride layer 22 and underlying $SiO_2$ layers, i.e., the cap TEOS $SiO_2$ layer 15 and TEOS $SiO_2$ plug 21. After this etching step, resist photo mask 23 is stripped and boron ions are implanted. Areas of the silicon substrate 11 and of the doped polysilicon fill 18' that are not protected by the silicon nitride layer 22 are doped. At this stage of the process, the structure 10 is illustrated in FIG. 4 which in particular shows the specific areas of the structure 10 that have been implanted. As apparent from FIG. 4, the drain of the NFET and the capacitor electrode to be connected therewith that are formed during the out diffusion step are identified by letters D and E respectively. This etching step is the most critical step of the PS module because it is performed with a fixed time which is only determined by the TEOS $SiO_2$ cap 15 and $SiO_2$ spacer 16 thicknesses. Therefore, a first important parameter is the maximum TEOS $SiO_2$ cap 15 thickness W that is permitted to be etched. In that respect, arrow referenced CP1 designates the critical point of this step. No further thinning of the $SiO_2$ spacer 16 that laterally protects the gate conductor 14 can be accepted beyond this point. To obtain good final yields it is essential that the tungsten silicide forming layer 14 will not be subsequently exposed. Parameters W, X and Y are shown in FIG. 4.

As apparent from FIG. 5, structure 10 is now conformally coated with a 100 nm thick undoped polysilicon layer 24. Then, structure 10 is heated to produce the out-diffusion of boron atoms from the silicon substrate 11 and polysilicon fill 18' into the portion of the undoped polysilicon layer 24 that is in contact therewith. In FIG. 6, a plurality of small arrows illustrates this out-diffusion effect and the boundaries of the doped portion of polysilicon layer 24 identified by numeral 24' are also shown therein. The remaining undoped polysilicon portions of layer 24 are eliminated by dipping the wafer in a KOH bath (selective wet process). As a result, only the doped portion of the polysilicon layer 24' forming the polysilicon strap remains above the structure 10 as depicted in FIG. 7.

In the PS module, a thin 21 nm thick $SiO_2$ layer 25 is thermally grown on the polysilicon strap 24' surface as shown in FIG. 8. After removal of the unprotected portions of the silicon nitride layer 22, the resulting final structure is shown in FIG. 9.

The conventional fabrication process continues with the formation of electrical contacts (personalization) in the back end of the line (BEOL) as standard.

As far as the polysilicon strap integrity is concerned, typical defects that can be observed when the above mentioned conventional fabrication process is employed are illustrated in FIGS. 10 and 11.

Now turning to FIG. 10(A), there is shown a good strap 24' that is obtained when "recess 2" depth X has the nominal value X0. If the "recess 2" depth is higher than the nominal value, an "open" strap is produced as apparent from FIG. 10(B) because the presence of a remaining portion of the $SiO_2$ plug 21, there is no access to the doped polysilicon fill 18'. Now, if the "recess 2" depth is lower than the nominal value, FIG. 10(C) shows that in this case, there is a short between the two adjacent straps 24'-1 and 24'-2.

Now turning to FIG. 11(A), there is shown the top portion of a deep trench 17 wherein the thickness of the TEOS $SiO_2$ plug 21 (parameter Y) has the nominal value Y0. In this case, after the dry etching step of FIG. 4 has been performed, the doped polysilicon fill 18' is correctly exposed, which in turn produces a good polysilicon strap 24'. If the TEOS $SiO_2$ plug 21 is too thick, because said dry etching is performed during a fixed time, the polysilicon strap 24' does not contact the doped polysilicon fill 18', leading to an "open" strap visible in FIG. 11(B). On the contrary, if the TEOS $SiO_2$ plug 21 is too thin, a short appears between the two polysilicon straps 24'-1 and 24'-2 as illustrated in FIG. 11(C).

In the above polysilicon strap fabrication process, the BOSS/MTTO dry etching step to expose the polysilicon fill 18' described by reference to FIG. 4 is therefore the most critical, mainly because this by-time etching step is limited by the TEOS $SiO_2$ cap 15 thickness W (and the $SiO_2$ spacer 16 thickness as well). If the BOSS/MTTO etching step is too long, both cap and spacer can be completely etched. When exposed to steam during the subsequent step of forming the $SiO_2$ layer 25, the tungsten silicide of the gate conductor 14 has a natural tendency to swell, thus leading to the destruction of the gate conductor stack 12. On the contrary, if it is too short, there is a serious risk that said fill 18' not be exposed. The etching time is a function of the TEOS $SiO_2$ plug thickness Y which in turn is related to the "recess 2" depth X. The measurement of depth X performed at the end of the "recess 2" etch step (at the DT module level) takes into account the thickness of the $Si_3N_4$ pad layer. Unfortunately this thickness is not uniform over the whole surface of a wafer (and from wafer to wafer of a same lot). The measurement is therefore inaccurate and moreover it is made outside the plasma etcher and not above the active area where the polysilicon straps are fabricated.

SUMMARY OF THE PRESENT INVENTION

Because, for device performance reasons, only very limited variations of parameter W are permitted, consideration must be given to the influence of the parameters X and Y, since they appear to have a key role as to polysilicon strap integrity at the PS module level, i.e., much later in the fabrication process. It has been discovered that unexpectedly the standard collar etch step which is performed at the very beginning of the conventional 16 Mb DRAM chip fabrication process is responsible for obtaining values for said parameters X (at the DT module level) and Y (at the STI module level) that may be quite different from their respective nominal values. As a matter of fact, it is to be noted that the lack of selectivity of the standard collar etch step was the main reason of producing a non uniform $Si_3N_4$ pad layer over the wafer, which in turn causes such undesired variations in the parameter values. In addition, this thickness non-uniformity renders the determination of the "recess 2" depth to be etched very difficult and inaccurate. Therefore, it is proposed hereunder a new collar dry etch method which aims to get rid of all these drawbacks and in particular, preserves the uniformity of the $Si_3N_4$ pad layer during subsequent processing.

In essence, according to an essential feature of the method of the present invention, a chemistry having a high TEOS $SiO_2/Si_3N_4$ selectivity (i.e., which etches TEOS $SiO_2$ faster than $Si_3N_4$ by a factor of at least six, but preferably eight, times) is used to perform the collar layer etch step. $C_4F_8$/Ar and $C_4F_8$/Ar/CO mixtures which have respective selectivities approximately equal to 9:1 and 15:1 (depending on gas ratios) are adequate in all respects. When the surface of the $Si_3N_4$ pad layer is reached (this can be accurately detected by an optical endpoint detection apparatus) the etch is continued by an overetch for a duration specifically adapted for each product to ensure a complete TEOS $SiO_2$ collar layer removal. This duration is set to completely expose the doped polysilicon fill ensuring thereby an excellent electrical contact therewith later on.

Thanks to the high selectivity of the new collar etch method, the thickness of the $Si_3N_4$ pad layer remains uniform over the whole surface of the wafer after TEOS $SiO_2$ collar layer an isotropic etching. The monitoring of the "recess 2" etch becomes easy, accurate and reliable. In addition, it may be conducted in-situ and just above a trench of the active area. As a final result, all the problems mentioned above are substantially eliminated.

The "recess 1" etch and the TEOS $SiO_2$ collar layer deposition steps may now have some differences with respect to the corresponding steps of the conventional fabrication process mentioned above.

It is therefore a primary object of the present invention to provide a new collar dry etch method that significantly improves polysilicon strap integrity in DRAM chips.

It is another object of the present invention to provide a new collar dry etch method that uses a highly $SiO_2/Si_3N_4$ selective chemistry, such as a $C_4F_8/Ar$ or $C_4F_8/Ar/CO$ mixture to an isotropically etch the TEOS $SiO_2$ collar layer.

It is another object of the present invention to provide a new collar dry etch method which preserves the $Si_3N_4$ pad layer thickness uniformity over the whole surface of the wafer for better wafer center to edge uniformity and wafer to wafer reproducibility.

It is another object of the present invention to provide a new collar etch method that allows an accurate determination (in-situ and near the active area) of the "recess 2" depth to be etched in the silicon substrate.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

BRIEF DESCRIPTION OF THE DRAWINGS

The present invention is illustrated by way of example and not limited in the figures of the accompanying drawings in which like references indicate similar elements; and in which:

FIGS. 2 to 9 show the silicon structure of FIG. 1 undergoing the sequence of specific processing steps to produce the polysilicon strap in the PS module;

FIG. 10 is comprised of parts (A), (B) and (C) that illustrate good, "open" and "short" straps when the process of FIGS. 2 to 9 is used and the "recess 2" depth value X is nominal, too high and too low respectively;

FIG. 11 is comprised of parts (A), (B) and (C) that illustrate good, "open" and "short" straps when the process of FIGS. 2 to 9 is used and the TEOS $SiO_2$ plug thickness value Y is nominal, too high and too low respectively;

DESCRIPTION OF THE PREFERRED EMBODIMENTS

Figure 12:
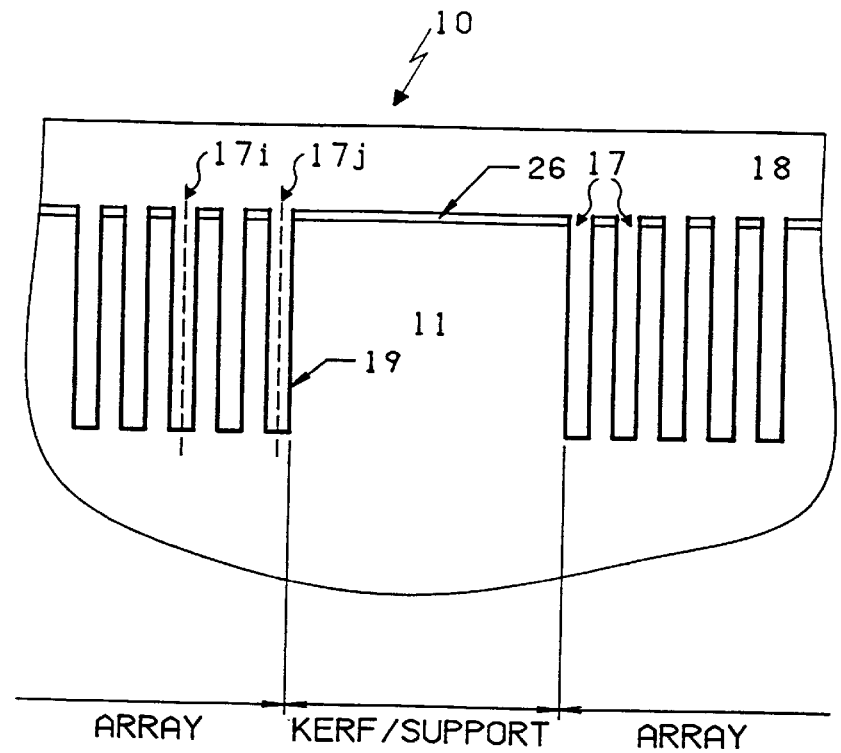
FIG. 12 shows the silicon structure of FIG. 1 at the very beginning (DT module) of said conventional fabrication process just after undoped polysilicon trench fill.

Let us consider the very initial processing steps of the standard fabrication process. First of all, a 14.5 nm thick $SiO_2$ layer is thermally grown onto the bare silicon substrate 11 surface. Then, a 175 nm thick $Si_3N_4$ layer and a 500 nm thick TEOS $SiO_2$ layer are deposited in sequence onto the structure. Next, they are patterned as standard to expose the deep trench locations, then used as an in-situ hard mask to etch the exposed silicon material in a plasma etcher to produce the deep trenches 17. The TEOS $SiO_2$ layer is removed by dipping in a BHF bath. In FIG. 12, the composite thermal $SiO_2/Si_3N_4$ layer, which will be referred to herein below as the $Si_3N_4$ pad layer, bears numeral 26.

Now, the ONO insulating layer 19 is formed in the trenches. Finally, a thick layer 18 of undoped polysilicon material is deposited onto the structure to completely fill the trenches 17. As such, the resulting structure 10 shown in FIG. 12 is produced by conventional processing steps. In FIG. 12, the "support/kerf" areas are clearly distinguished from the "array" or "active" areas (where the trenches and thus the polysilicon straps are produced). The standard "recess 1" etch, TEOS $SiO_2$ collar layer deposition and collar etch steps will be now described by reference to FIGS. 13 to 15 which represent an enlarged view of a half trench 17i situated at the center of the "array" area and of a half trench 17j situated adjacent to the "kerf-support" area that are disposed contiguous.

First, the structure 10 is submitted to the "recess 1" etch step. During this step, the undoped polysilicon fill 18 is etched with a high polysilicon/$Si_3N_4$ selectivity, down to 2.5 μm into the deep trenches 17 to form a recess referenced 27 in FIG. 13. As apparent from FIG. 12, the $Si_3N_4$ pad layer 26 has a uniform thickness (given by its nominal thickness T) irrespective the "array" or the "kerf/support" area. Then, a 275 nm thick TEOS $SiO_2$ layer 20 is conformally deposited onto the structure to form the collar. As apparent from FIG. 14, the TEOS $SiO_2$ collar layer 20 is thinner in the "array" area than in the "kerf/support" area, so that its thickness is not uniform over the whole wafer surface. Now, the TEOS $SiO_2$ collar layer 20 needs to be removed from the top of the $Si_3N_4$ pad layer 26 and simultaneously from the bottom of the trench 17 (to expose the undoped polysilicon fill 18). A conventional an isotropic dry etching is now performed with the following operating conditions.

CHF$_3$: 100 sccm

He/O$_2$: 20 sccm

Pressure: 9 Pa (70 mTorr)

Mag. field: 0 Gauss

RF Power: 470 watt

Optical endpoint: Yes

Figure 15:
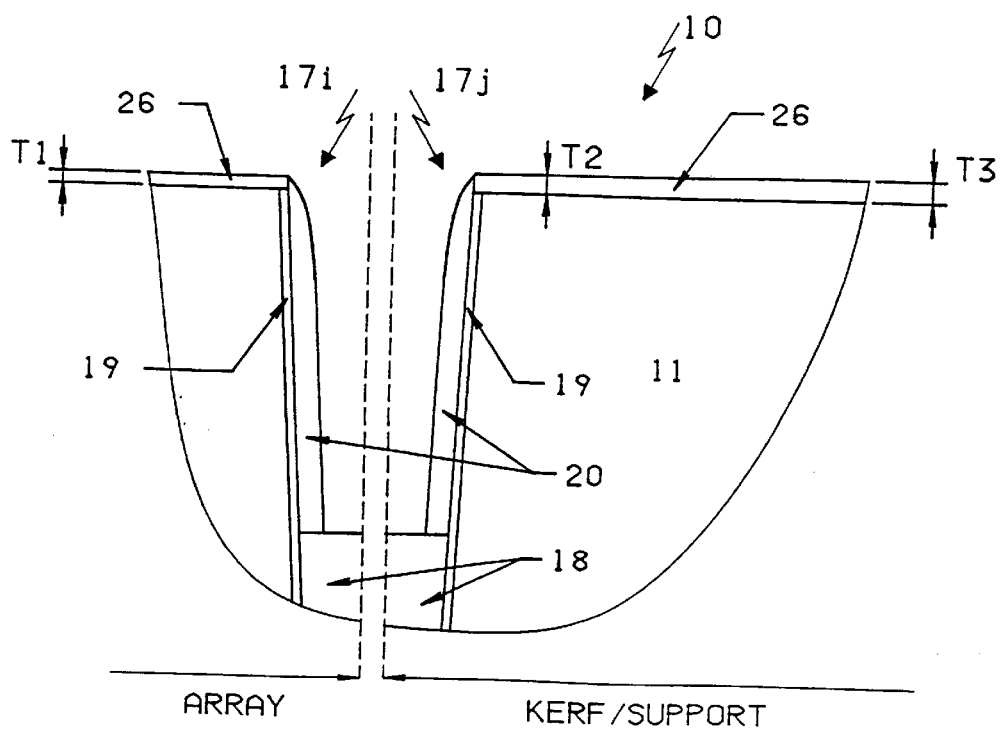

At this stage of the process the resulting structure is shown in FIG. 15.

As apparent from FIG. 15, after collar etch, the thickness of the $Si_3N_4$ pad layer 26 is no longer uniform over the wafer as illustrated by the different thicknesses T1, T2 and T3 at three different locations. In FIG. 15, it is interesting to notice that the sloped surface of the TEOS $SiO_2$ collar layer 20 has been transferred to underlying $Si_3N_4$ pad layer 26.

Now, the recess is filled with doped polysilicon, then planarized using the $Si_3N_4$ pad layer 26 as an etch stop layer in a plasma etcher. A sample wafer is extracted from the plasma etcher and the $Si_3N_4$ pad layer thickness is measured above the "kerf/support" area (i.e., T3). During the "recess 2" etch (still in the DT module) the doped polysilicon fill 18' is etched to reach the desired depth target X0=160 nm measured from the silicon substrate surface just under the $Si_3N_4$ pad layer 26. As apparent from FIG. 16, for these two distant half trenches 17i and 17j, one in the "array, the other in the "kerf/support" area, the "recess 2" depth varies between two values X1 and X2.

Now the TEOS $SiO_2$ plug is formed. To that end, the wafer is transferred in the STI module where shallow isolation trenches are built to isolate each capacitor formed in a deep trench from its neighbors. The STI module includes a chemical-mechanical polishing (CMP) step which is essential in the TEOS $SiO_2$ plug formation. More details as to operations conducted in the STI module can be found in co-pending U.S. patent application Ser. No. 98/751, 596 filed Nov. 18, 1996 assigned to the present assignee which is incorporated herein by reference. FIG. 17 shows the silicon structure of FIG. 16 after TEOS $SiO_2$ plug formation. As a consequence of the "recess 2" depth variations and $Si_3N_4$ pad layer thickness differences mentioned above, the TEOS $SiO_2$ plug thickness is not constant. For said two distant half trenches 17i and 17j, this thickness varies between Y1 and Y2.

Next, the wafer is transferred successively in the GC module for gate conductor stack/$SiO_2$ spacer formation then in the PS module to perform the processing steps that have been described in conjunction with FIGS. 2 to 9.

Figure 1:
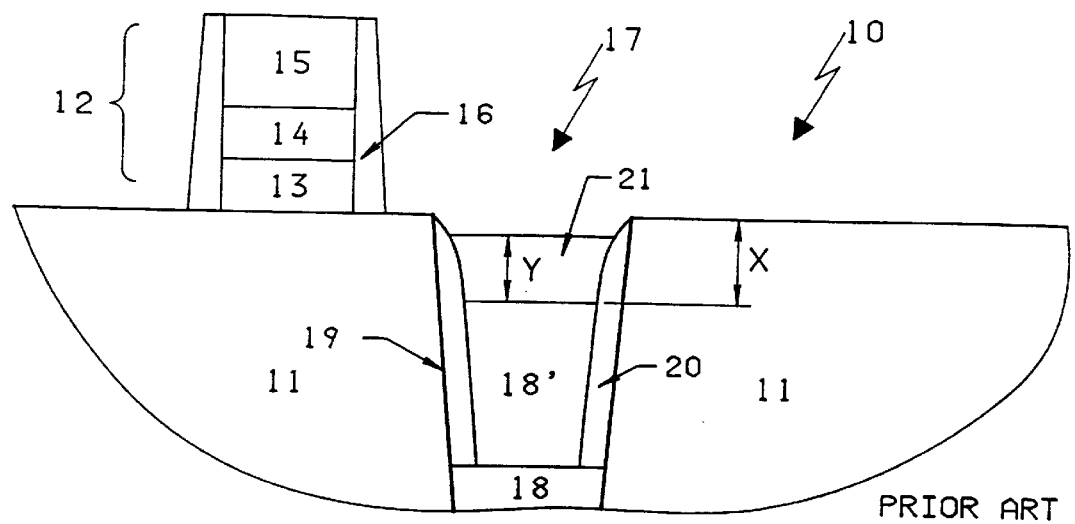
FIG. 1 shows a silicon structure after the gate conductor stack/$SiO_2$ spacer formation has been completed according to a conventional 16 Mb DRAM chip fabrication process and before the PS module.
Figure 2:
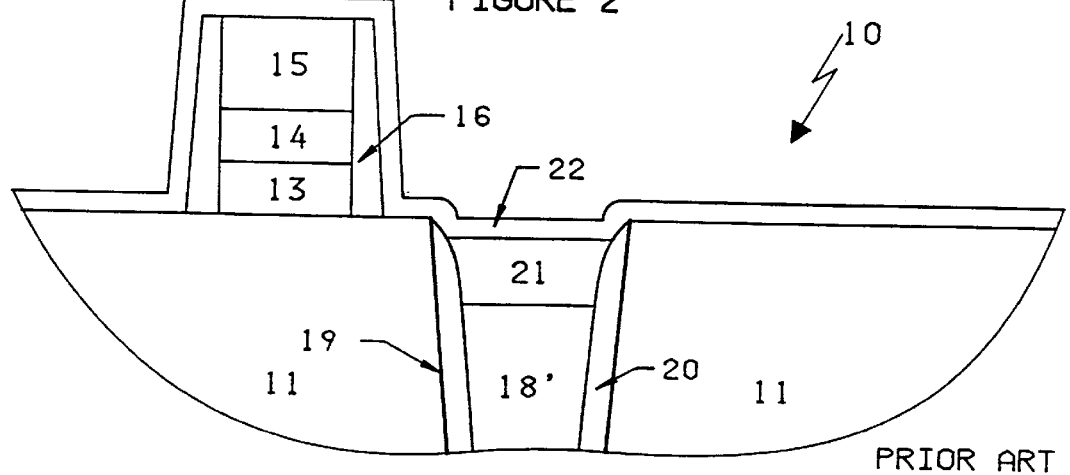
Figure 3:
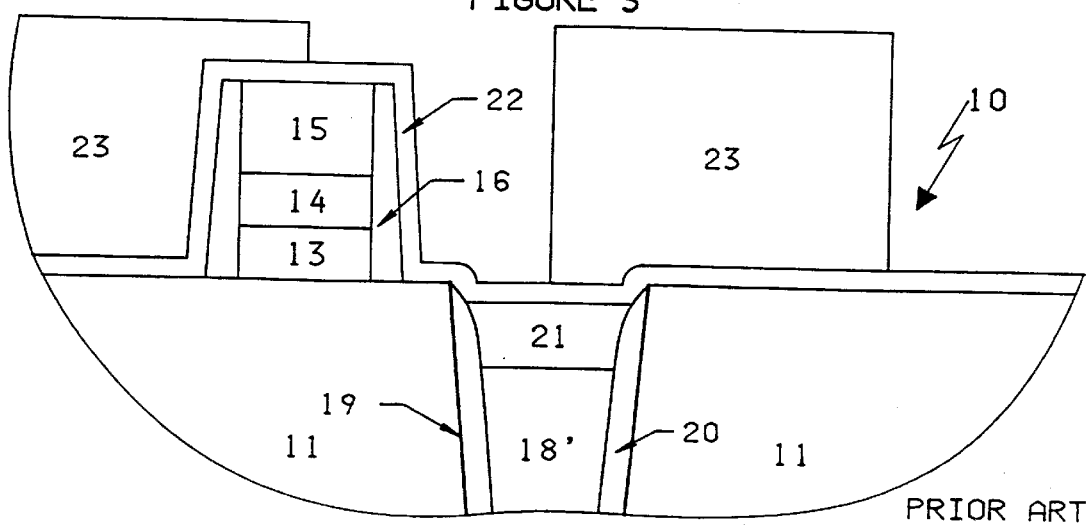
Figure 4:
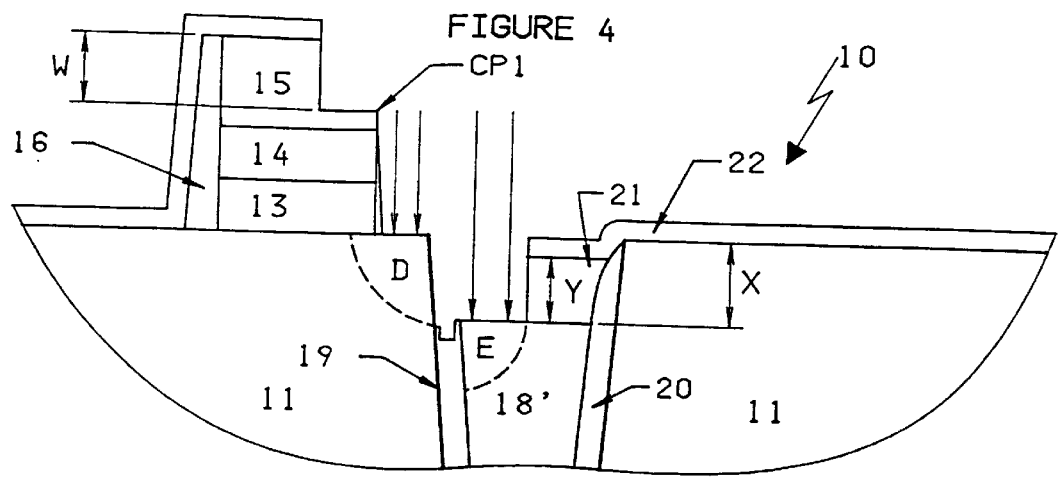
Figure 5:
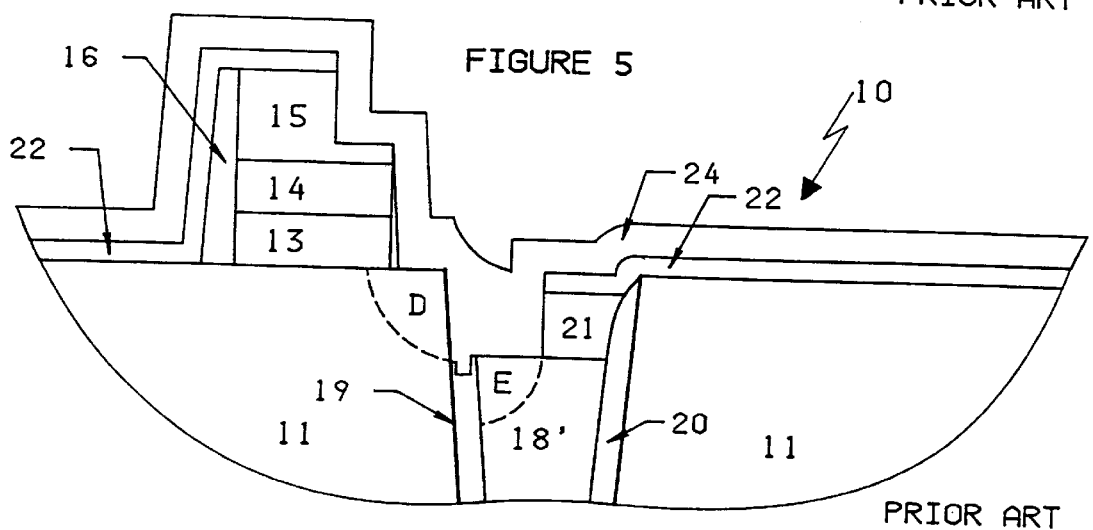
Figure 6:
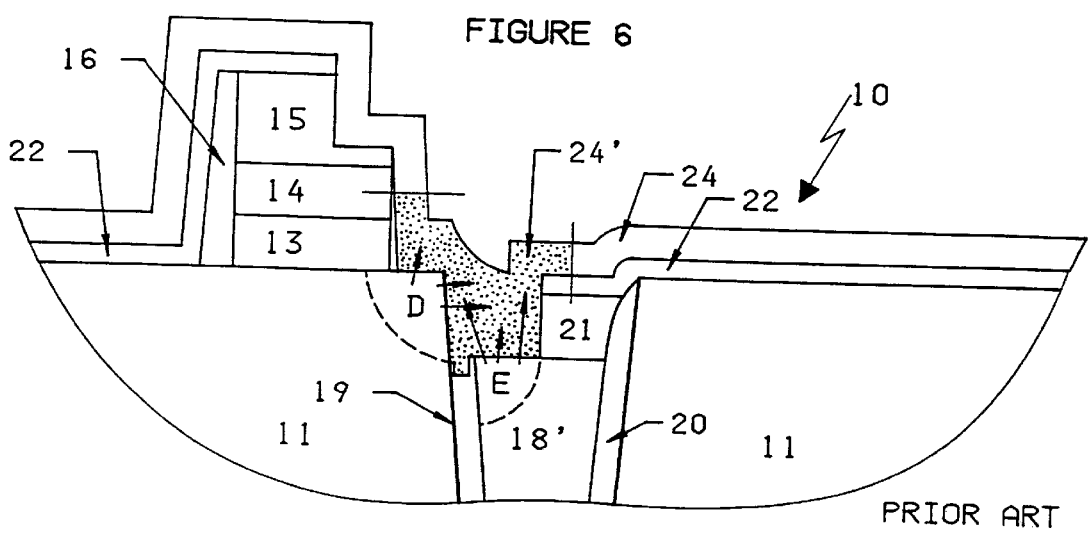
Figure 16:
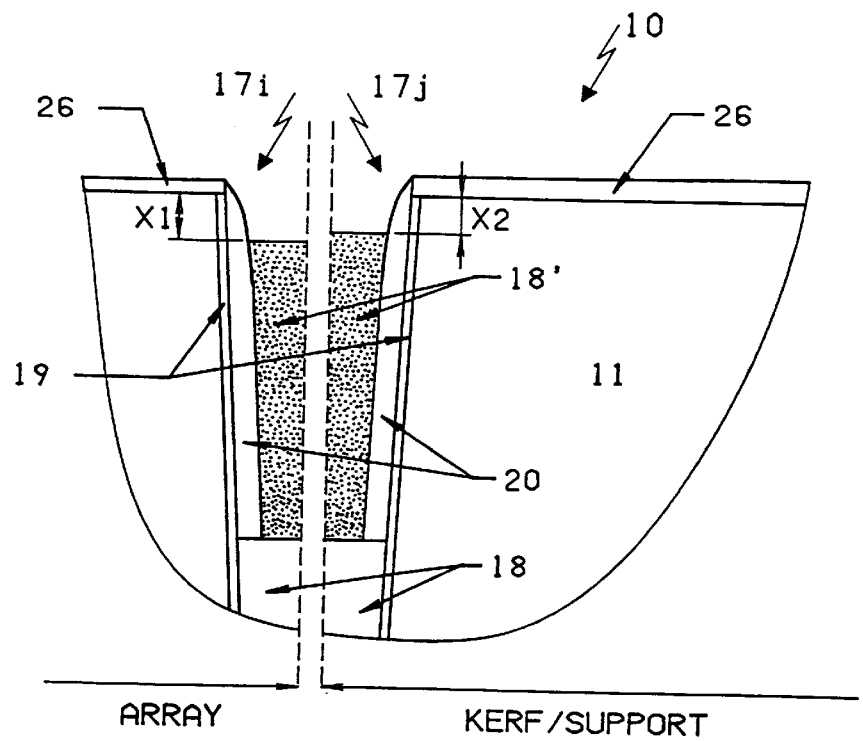
FIGS. 16 and 17 respectively show the silicon structure of FIG. 15 at the DT module level to illustrate the "recess 2" depth variations and later on at the STI module level to illustrate the TEOS $SiO_2$ plug thickness variations.
Figure 17:
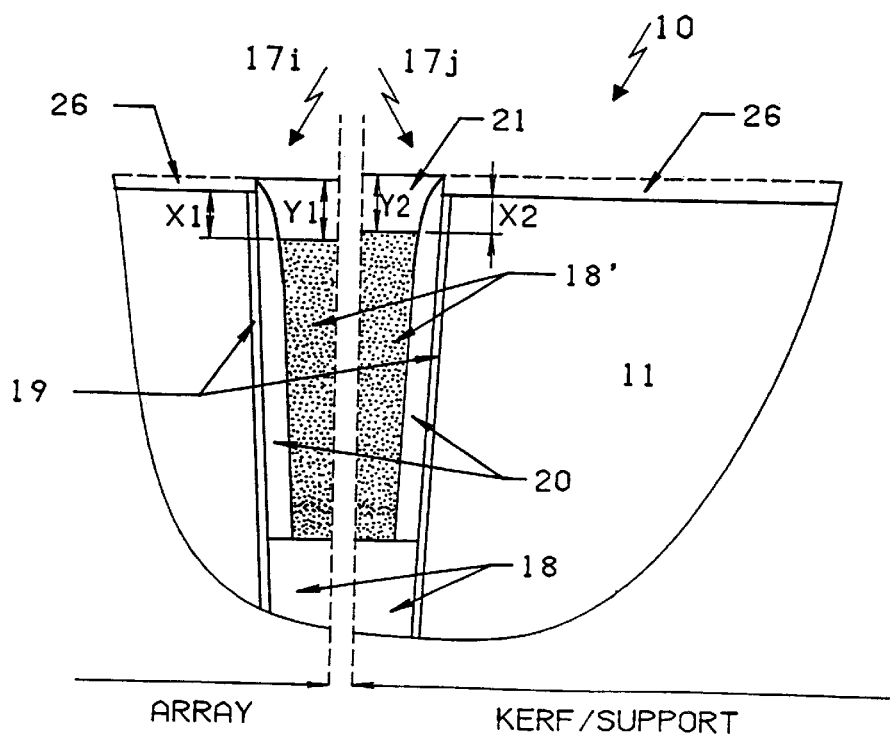

From the above considerations by reference to FIGS. 16 and 17, it is clear that parameters X (the "recess 2" depth or height difference between the silicon substrate 11 surface and the doped polysilicon fill 18') and Y (the TEOS $SiO_2$ plug 21 thickness) that are shown in FIG. 4 at the PS module level are the two major polysilicon strap integrity detractors. Parameter W (the maximum thickness of the TEOS cap 15 that is permitted to be etched) is also of concern, but only small variations thereof are tolerated. On the other hand, the influence of these parameters on the polysilicon strap integrity has been discussed above by reference to FIGS. 10 and 11.

Based on the observation of FIGS. 10 and 11, applicant's inventors have remarked that depending on the value of parameters X and Y with regards to their respective nominal values X0 and Y0, the risk of "open" straps or "short" straps varies as follows. Let us assume first that the "recess 2" depth X is higher than specified (X>X0). The risk to have an "open" strap is high if the TEOS $SiO_2$ plug is thicker than specified (Y>Y0), it is low if the TEOS $SiO_2$ plug thickness is lower than specified (Y<Y0). On the contrary, i.e. in the case the recess 2" depth X is lower than specified (X<X0), the risk to have a "short" strap is high if the TEOS $SiO_2$ plug thickness is lower than specified (Y<Y0) and low otherwise.

Faced with this problem, applicant's inventors have conducted thorough experiments. They have discovered that unexpectedly good X and Y values are depending upon a good thickness uniformity of the $Si_3N_4$ pad layer after the collar etch step. This $Si_3N_4$ pad layer is used as a hard mask at the very beginning of the 16 Mb DRAM chip fabrication process. As a matter of fact, applicant's inventors have observed that the $Si_3N_4$ pad layer is thicker at the center of the "kerf/support" area and is thinner at the center of the "array" area. The thickness difference is about 60 nm. They have also demonstrated that these $Si_3N_4$ pad layer thickness differences are inherent to the standard collar dry etch step described above. Therefore, they have investigated a new collar etch method which, because it preserves the uniformity of said $Si_3N_4$ pad layer, eliminates the above mentioned polysilicon strap integrity problems.

Applicant's inventors main contribution thus resides in the understanding that the standard collar dry etch step of the conventional fabrication process described above has a too low TEOS $SiO_2$/$Si_3N_4$ selectivity. Due to the thickness differences mentioned above, when TEOS $SiO_2$ collar layer 20 is removed, the $Si_3N_4$ pad layer 26 is etched at locations this TEOS $SiO_2$ layer is the thinnest. In FIG. 15, capital letters T1, T2 and T3 indicate the thickness of the $Si_3N_4$ pad layer 26 at three different locations. These thickness differences are the cause of the "recess 2" depth X variations with respect to the nominal value X0. Both effects are combined to produce said TEOS $SiO_2$ plug thickness Y variations noticed above.

The new collar etch step for an isotropically removing the collar TEOS $SiO_2$ layer 20 is performed with a highly selective chemistry. To that end, a $C_4F_8$/Ar mixture that has a high $SiO_2$/$Si_3N_4$ selectivity (up to 9/1 depending on parameters setting) is used.

Ar: 150 sccm
$C_4F_8$: 5 sccm
Pressure: 20 Pa (150 mTorr)
Mag field: 50 Gauss
RF Power: 900 watt
Optical endpoint: Yes
Sel.$SiO_2$/$Si_3N_4$: 9/1 (blanket)
Uniformity: <4%

If a selectivity greater than 9/1 (e.g., 15/1) is desired, carbon oxide CO should be added.

Ar: 90 sccm
$C_4F_8$: 4 sccm
CO: 15 sccm
Pressure: 7 Pa (50 mTorr)
Mag field: 17 Gauss
RF Power: 800 watt
Optical endpoint: Yes
Sel.$SiO_2$/$Si_3N_4$: 15/1 (blanket)
Uniformity: <4%

Figure 18:
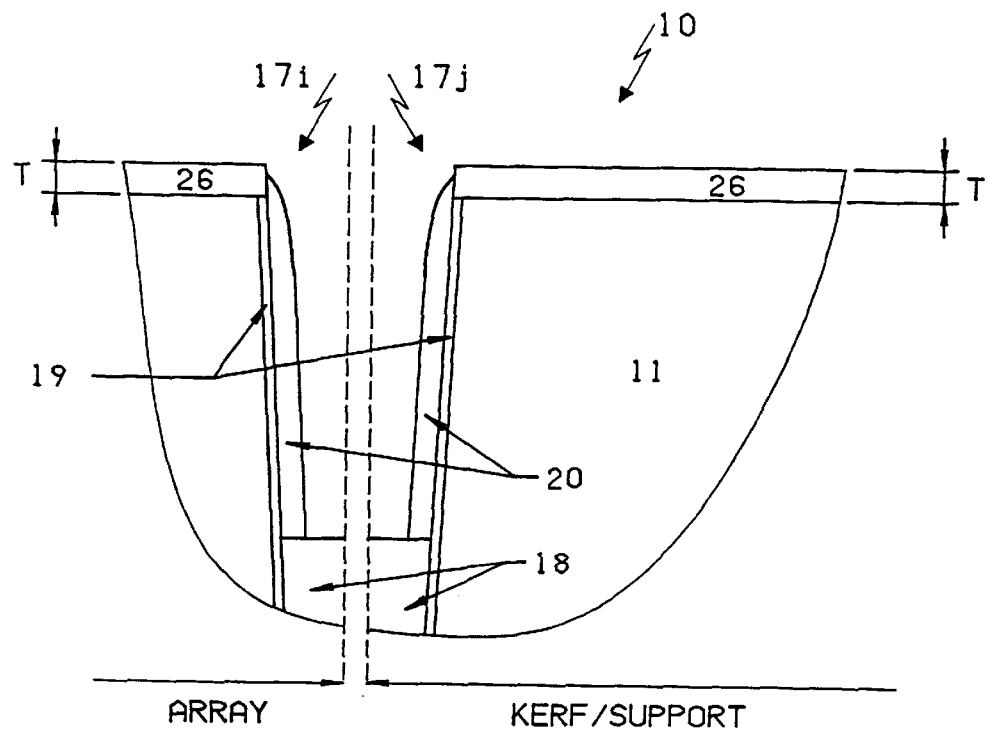
FIG. 18 shows the silicon structure of FIG. 14 after the novel collar dry etch step has been performed to an isotropically remove the TEOS $SiO_2$ collar layer while preserving the $Si_3N_4$ pad layer thickness uniformity.

As apparent from the above operating conditions, an accurate interferometric etch endpoint detection technique can be used. As a consequence, the TEOS $SiO_2$ collar material is etched until the $Si_3N_4$ pad layer surface is attained (automatically and accurately detected by an optical/interferometric apparatus), then continued for a determined period of time (determined by the product in consideration) for overetching. This overetch is conducted to remove completely the TEOS $SiO_2$ collar material on top of the $Si_3N_4$ pad layer 26 and at bottom of recess 27 to expose the undoped polysilicon fill 18. For instance, when the said conventional fabrication process is used the duration of the $C_4F_8$/Ar etch step is 60 sec and the overetch duration is 30 sec. The overetch duration is not critical because the high TEOS $SiO_2$/$Si_3N_4$ selectivity. The resulting structure is shown in FIG. 18. Note that, should some carbon based polymers remain in recess 27 after the collar etch step (in case CO is used), they will be removed by an appropriate wet or dry process. As apparent from FIG. 18, the thickness of the $Si_3N_4$ pad layer 26 is substantially the same (and equal to the nominal value T) over the whole surface of structure 10.

An acceptable method variant would consist of using the conventional $CHF_3/He/O_2$ etch step mentioned above until the $Si_3N_4$ pad layer is reached and then to terminate by an overetch step performed with the $C_4F_8/Ar$ or the $C_4F_8/Ar/CO$ highly selective chemistry according to the present invention.

Thanks to the new collar etch method, the $Si_3N_4$ pad layer thickness is now substantially uniform. It has been demonstrated from practical experiments that the $Si_3N_4$ pad layer thickness is really uniform all across the wafer ("kerf/support" to "array,. center to edge of array, . . . ), i.e. substantially the same thickness T is obtained over the whole wafer. As result, the determination of the "recess 2" depth to be etched is now accurate and reliable since the measurement to determine the $Si_3N_4$ pad layer can be now conducted in-situ and above the active or "array" surface of the wafer. In addition, same experiments have also shown an excellent wafer to wafer reproducibility.

Figure 19:
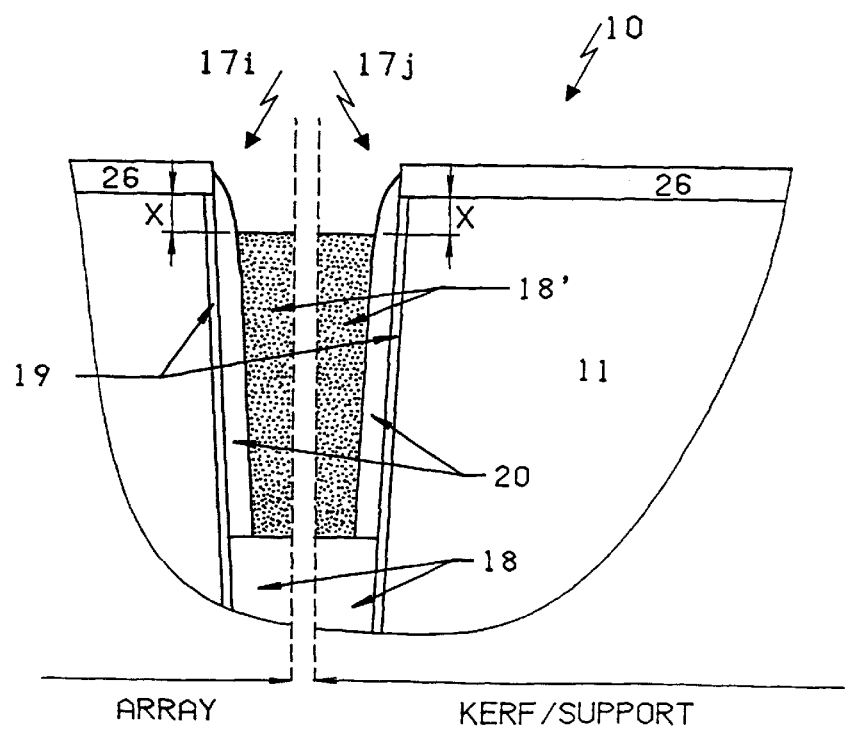
FIGS. 19 and 20 respectively show the structure of FIG. 18 at the DT module level to illustrate the absence of such "recess 2" depth variations and later on at the STI module level to illustrate that a quite uniform TEOS $SiO_2$ plug thickness has been obtained.

FIG. 19 shows the structure of FIG. 18 after completion of processing steps mentioned above (polysilicon filling, planarization, . . . ) and terminated by the "recess 2" etch to illustrate that there is no longer any "recess 2" depth differences between the said two distant half trenches 17i and 17j.

Figure 20:
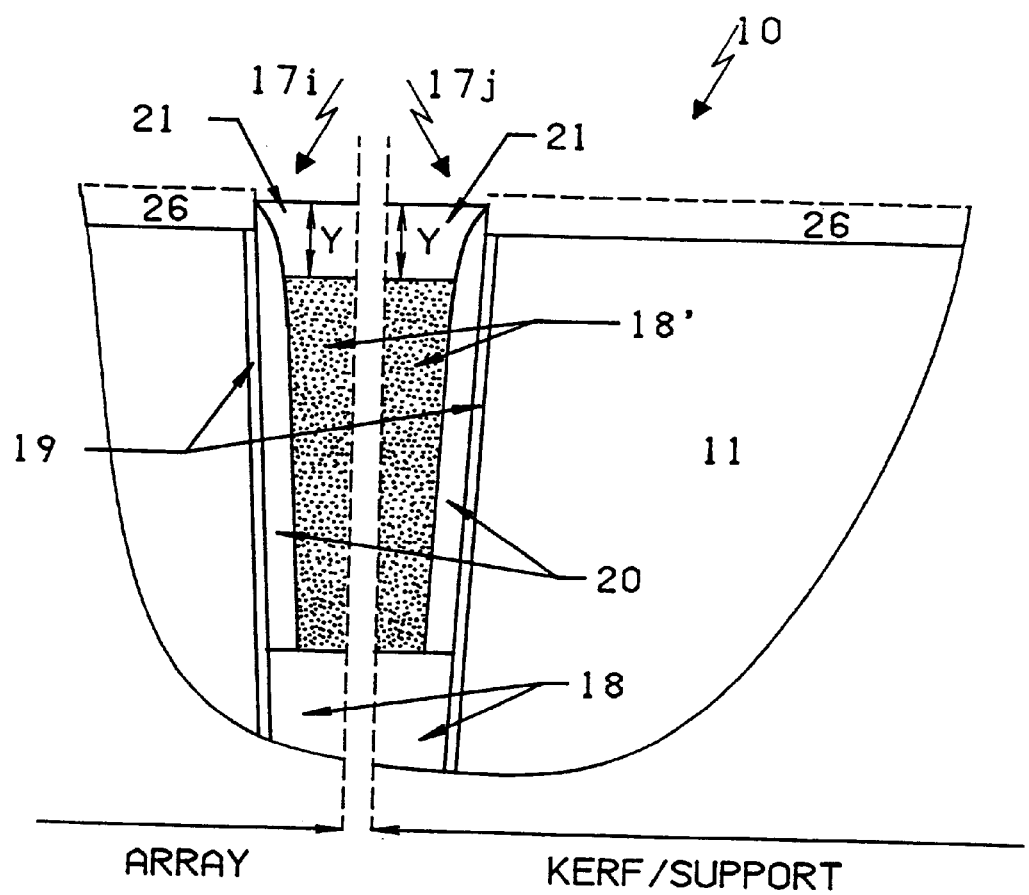

Finally, FIG. 20 shows the structure of FIG. 19 after $Si_3N_4$ pad layer stripping (at the STI module level) once the TEOS $SiO_2$ plug 21 has been formed to illustrate that its thickness is now constant.

Figure 13:
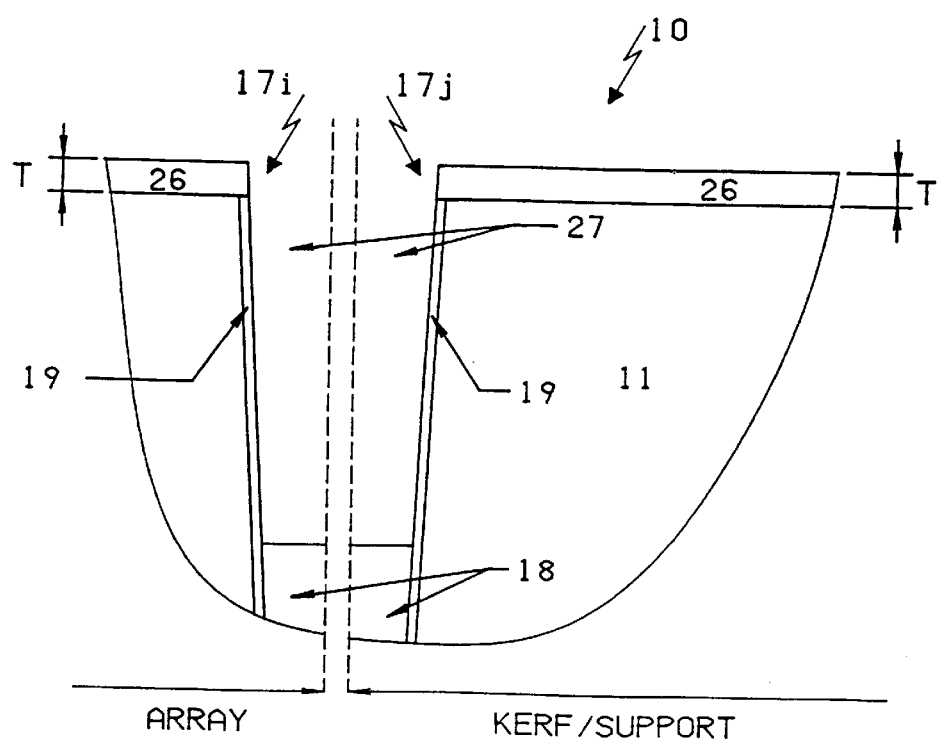
FIGS. 13 to 15 show the silicon structure of FIG. 12 undergoing the standard "recess 1" etch, TEOS $SiO_2$ collar deposition and collar etch steps.
Figure 14:
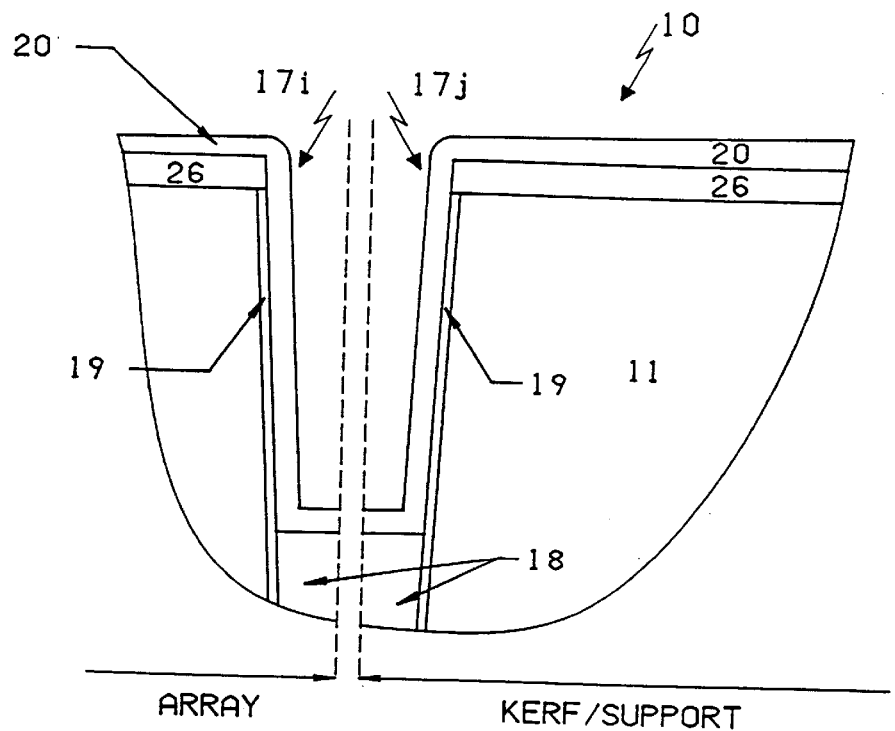

Note that steps described by reference to FIGS. 13 and 14 are still valid for the new collar etch process. They are roughly the same except that some adjustments can be made. As the chemistry of the novel collar dry etch step is much more an isotropic because of its high selectivity when compared to the chemistry used in the standard collar dry etch step, the thickness of the TEOS $SiO_2$ collar layer 20 can be reduced while still resulting in the same final thickness. Because, thickness reduction of the TEOS $SiO_2$ collar layer 20 (and the $Si_3N_4$ pad layer 26 as well) means less deposition time, a significant saving of money can be expected.

Because an uniform $Si_3N_4$ pad layer thickness is obtained overall, i.e. over the different areas of the wafer (center to edge and "array" to "kerf/support" areas), the new collar etch method of the present invention has positive effects in terms of manufacturing yields, cost reduction, easy processing and reproducibility. Yields are improved because "open" and "short" strap related defects are substantially eliminated, so that the BOSS/MTTO etch process window is no longer a concern at the PS module level. It also widens the STI module process window as it improves the $Si_3N_4$ pad layer budget (amount of $Si_3N_4$ material removed by the consecutive processing steps, between the deposition and stripping of the $Si_3N_4$ pad layer). Moreover, it reduces the risk of "silicon polish" in the STI module. Cost improvements result from the $Si_3N_4$ pad layer and collar TEOS $SiO_2$ layer possible thickness reduction which in turn reduces the turn around time (TAT). The "recess 2" depth and the TEOS $SiO_2$ collar layer thickness variations are no longer a concern for strap integrity. Wafers produced according to the teachings of the present method have a better "recess 2" depth and strap uniformities (center to edge of wafer, "array" to "support/kerf" areas) and the incidence of the pattern factor effects is significantly reduced. Finally, a better reproducibility wafer to wafer can be obtained because of $Si_3N_4$ pad layer stability.

The improved collar etch method of the present invention finds extensive applications in the semiconductor industry, and in particular in the fabrication of 16 Mbit DRAM and logic products. It is perfectly adapted to future technologies (e.g., 64 Mb and 256 Mb DRAM chips).

In the foregoing specification the invention has been described with reference to specific exemplary embodiments thereof. It will, however, be evident that various modifications and changes may be made thereto without department from the broader spirit and scope of the invention as set forth in the appended claims. The specification and drawings are accordingly to be regarded as illustrative rather than a restrictive sense.

What is claimed is:

1. An improved etch method for etching a structure (10) of a TEOS $SiO_2$ collar layer (20) having a non-uniform thickness that is conformally deposited onto a $Si_3N_4$ pad layer coated silicon substrate with exposed trenches (17) partially filled with silicon (18); said method comprising the steps of:

a) anisotropically dry etching the structure with a highly TEOS $SiO_2/Si_3N_4$ and polysilicon chemistry that etches TEOS $SiO_2$ at least six times faster than $Si_3N_4$ and polysilicon;

b) detecting the instant the underlying $Si_3N_4$ pad layer is reached; and c) continuing said dry etching for a determined period of time to completely remove the TEOS $SiO_2$ material atop the $Si_3N_4$ pad layer and at the bottom of the trench above the polysilicon but not in the trench sidewalls.

2. The method of claim 1 wherein said highly selective chemistry consists of a $C_4F_8/Ar$ mixture.

3. The method of claim 2 wherein the dry etching of steps a) and c) is conducted in the reaction chamber of a plasma etcher tool with the following operating conditions:

Ar: 150 sccm $C_4F_8$: 5 sccm

Pressure: 20 Pa (150 mTorr)

Mag field: 50 Gauss

RF Power: 900 watt

Endpoint detect: Yes

Sel.$SiO_2/Si_3N_4$: 9/1 (blanket)

Uniformity: <4%.

4. The method of claim 1 wherein said highly selective chemistry consists of a $C_4F_8/Ar/CO$ mixture.

5. The method of claim 4 wherein the dry etching of steps a) and c) is conducted in the reaction chamber of a plasma etcher tool with the following operating conditions:

Ar: 90 sccm $C_4F_8$: 4 sccm

CO: 15 sccm

Pressure: 7 Pa (50 mTorr)

Mag field: 17 Gauss

RF Power: 800 watt

Endpoint detect: Yes

Sel.$SiO_2/Si_3N_4$: 15/1 (blanket)

Uniformity: <4%.

6. An improved etch method for etching a structure of TEOS $SiO_2$ collar layer having a non-uniform thickness that is conformally deposited onto a $Si_3N_4$ pad layer coated silicon substrate with exposed trenches partially filled with silicon; said method comprising the steps of:

a) anisotropically dry etching the structure with a highly selective TEOS $SiO_2/Si_3N_4$ chemistry that etches TEOS $SiO_2$ at least six times faster than $Si_3N_4$ wherein the dry etching is conducted in the reaction chamber of a plasma etcher tool with the following operating conditions:
CHF3: 100 sccm
He/O2: 20 sccm
Pressure: 9 Pa (70 mTorr)
Mag. field: 0 Gauss
RF Power: 470 watt
Endpoint detect: Yes b) detecting the instant the underlying $Si_3N_4$ pad layer is reached; and c) continuing said dry etching for a determined period of time to completely remove the TEOS $SiO_2$ material atop the $Si_3N_4$ pad layer and at the bottom of the trench, wherein the dry etching is conducted in the same reaction chamber of the plasma etcher tool but with either one of the following operating conditions:
Ar: 150 sccm
C4F8: 5 sccm
Pressure: 20 Pa (150 mTorr)
Mag field: 50 Gauss
RF Power: 900 watt
Endpoint detect: Yes
Sel.$SiO_2$/$Si_3N_4$: 9/1 (blanket)
Uniformity: <4% or

Ar: 90 sccm
C4F8: 4 sccm
CO: 15 sccm
Pressure: 7 Pa (50 mTorr)
Mag field: 17 Gauss
RF Power: 800 watt
Endpoint detect: Yes
Sel.$SiO_2$/$Si_3N_4$: 15/1 (blanket)
Uniformity: <4%.

7. The method of claim 6 wherein said $Si_3N_4$ pad layer top surface is detected by an interferometric technique.

* * * * *